United States Patent
Conn et al.

(10) Patent No.: US 11,678,465 B2
(45) Date of Patent: Jun. 13, 2023

(54) THERMAL INTERFACE APPARATUS FOR PCI EXPRESS M.2 PRINTED CIRCUIT ASSEMBLIES

(71) Applicant: HEWLETT PACKARD ENTERPRISE DEVELOPMENT LP, Houston, TX (US)

(72) Inventors: Kevin Conn, Houston, TX (US); Pinche Tsai, Houston, TX (US); Keith Sauer, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 85 days.

(21) Appl. No.: 17/277,772

(22) PCT Filed: Nov. 8, 2018

(86) PCT No.: PCT/US2018/059815
§ 371 (c)(1),
(2) Date: Mar. 19, 2021

(87) PCT Pub. No.: WO2020/096602
PCT Pub. Date: May 14, 2020

(65) Prior Publication Data
US 2021/0352821 A1    Nov. 11, 2021

(51) Int. Cl.
*H05K 7/20* (2006.01)
*H05K 1/02* (2006.01)

(52) U.S. Cl.
CPC ......... *H05K 7/2039* (2013.01); *H05K 1/0203* (2013.01)

(58) Field of Classification Search
CPC ........ G06F 1/20; G06F 1/1684; G06F 1/1658; H05K 7/2039; H05K 1/0203;
(Continued)

(56) References Cited

U.S. PATENT DOCUMENTS 6,762,939 B2    7/2004   Summers et al.
7,457,122 B2 *  11/2008  Lai ...................... H01L 23/4093
                                                       257/E23.103
(Continued)

FOREIGN PATENT DOCUMENTS

CN    101562962 B    9/2011
CN    206353913 U    7/2017
KR    20070046230 A  5/2007

OTHER PUBLICATIONS

Brandenburg, S. D., "Overmolded Electronic Assembly Packaging," Extension Media, 2018, http://electroiq.com/blog/2004/07/overmolded-electronic-assembly-packaging/.

(Continued)

*Primary Examiner* — Adam B Dravininkas
(74) *Attorney, Agent, or Firm* — Sheppard Mullin Richter & Hampton LLP

(57) ABSTRACT

In some embodiments, an apparatus comprises an integrated circuit module comprising two layers of thermal interface material, a printed circuit assembly disposed between the two layers of thermal interface material and comprising a plurality of integrated circuits disposed on both sides of a circuit board, wherein at least one of the integrated circuits is thermally coupled with one of the layers of thermal interface material, and two heat spreaders adapted to removably retain one another, and when retaining one another to enclose and become thermally coupled with the two layers of thermal interface material; and a printed circuit board having a connector disposed thereon, wherein a connector edge of the printed circuit assembly is disposed within the connector. In other embodiments, a frame is adapted to retain the two heat spreaders.

17 Claims, 11 Drawing Sheets

(58) Field of Classification Search
CPC ............... H05K 7/20454; H05K 7/20; H05K 2201/066; H05K 7/20418; H05K 7/20509
See application file for complete search history.

(56) References Cited

U.S. PATENT DOCUMENTS

| | | | |
|---|---|---|---|
| 9,326,424 B2 | 4/2016 | Park et al. | |
| 2003/0011993 A1* | 1/2003 | Summers | H01L 23/4093 361/704 |
| 2003/0156386 A1* | 8/2003 | Summers | H05K 1/0204 29/890.03 |
| 2003/0189815 A1* | 10/2003 | Lee | H01L 23/427 361/679.52 |
| 2005/0207115 A1* | 9/2005 | Barsun | G06F 1/20 257/E23.102 |
| 2006/0221573 A1* | 10/2006 | Li | G11C 5/143 257/E23.101 |
| 2006/0285806 A1 | 12/2006 | Ahrens | |
| 2007/0195489 A1* | 8/2007 | Lai | G11C 5/143 361/600 |
| 2009/0116195 A1* | 5/2009 | Yang | H01L 23/3675 361/709 |
| 2014/0037254 A1* | 2/2014 | Wang | H04B 10/801 385/94 |
| 2017/0172017 A1* | 6/2017 | Frank | H05K 7/2039 |
| 2018/0100964 A1 | 4/2018 | Huang et al. | |
| 2018/0203490 A1 | 7/2018 | Kim | |
| 2019/0181582 A1* | 6/2019 | Beltran | G06F 1/20 |

OTHER PUBLICATIONS

Zweben, C., "Advanced Thermal Management Materials," Advancements in Thermal Management 2012, Sep. 18, 2012, 107 pages.
International Search Report and Written Opinion received for PCT Patent Application No. PCT/US2018/059815, dated Aug. 8, 2019, 11 pages.

* cited by examiner

THERMAL INTERFACE APPARATUS FOR PCI EXPRESS M.2 PRINTED CIRCUIT ASSEMBLIES

BACKGROUND

Modern computer systems generate large quantities of heat. While some of this heat is generated by power supplies and the like, the majority of the heat is often generated by integrated circuits such as processors and memory chips. In order to function properly, these computer systems must be kept within a certain temperature range. Therefore, the heat generated by these processors and memory chips must be dissipated or otherwise removed.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

Printed circuit assemblies generate a lot of heat, especially in high-density configurations. One of the newer printed circuit assemblies is the Peripheral Component Interconnect Express M.2 printed circuit assembly (hereinafter "PCIe M.2 PCA"). The PCIe M.2 PCA is defined by the M.2 specification, formerly known as the Next Generation Form Factor (NGFF) specification. The M.2 specification defines internally mounted computer expansion cards and associated connectors. One of the computer bus interfaces provided through the M.2 connector is the PCIe bus interface.

In some circumstances, it may be difficult to properly cool printed circuit assemblies, such as PCIe M.2 PCAs. In particular, these PCAs generate much more heat that prior PCAs, while rejecting much less heat. These PCAs feature a very high component density, and this density is increasing with new designs to support greater functionality. In addition, these PCAs feature a double-sided topology, with components mounted on both sides. Therefore the heat generated is roughly double that of a single-sided board. Additionally, the cooling provided by the unpopulated side of a single-sided board is not available with a double sided board. The result is much greater heat generation with much less heat rejection. Another difficulty with cooling these PCAs results from the thinness of the PCA board. As described below, prior attempts to cool these PCAs have resulted in bending the board, causing components to separate from the board.

Accordingly, disclosed herein are example techniques for cooling printed circuit assemblies that solve the above noted difficulties. In particular, in the examples disclosed herein, the PCA is sandwiched between two thermal interface pads that flexibly conform to the components mounted on both sides of the PCA, and that efficiently conduct heat away from those components. In addition, the sandwich is encased in a rigid metal structure that both provides additional cooling by conducting heat away from the thermal interface pads, and also provides structural rigidity, thereby preventing flexure of the PCA board.

Figure 1:
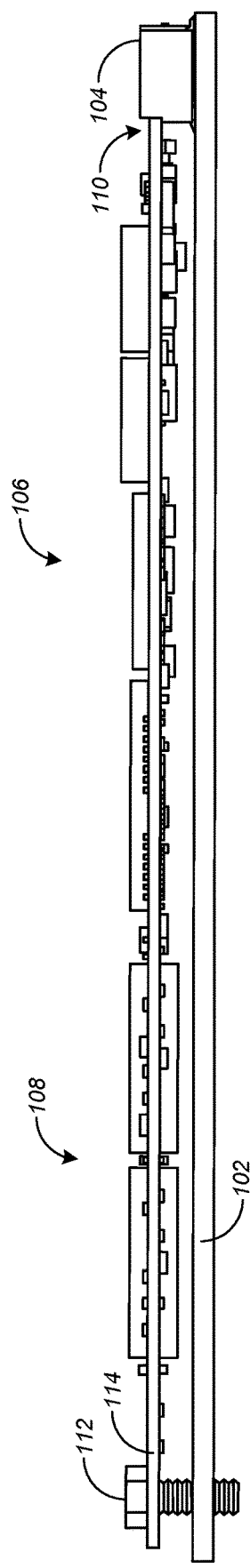
FIG. 1 shows a PCI Express M.2 printed circuit assembly mounted on a PCI printed circuit board.

FIG. 1 shows a PCIe M.2 PCA mounted on a PCI printed circuit board (hereinafter "PCI PCB"). However, while various embodiments are described in terms of the PCIe M.2 PCA and the PCI PCB, it should be understood that the disclosed technology is applicable to other PCAs and PCBs. Referring to FIG. 1, a PCI PCB 102 includes an M.2 connector 104 mounted thereon. Also shown is a PCIe M.2 PCA 106. The PCIe M.2 PCA 106 is a two-sided printed circuit assembly, having integrated circuits, shown generally at 108, mounted on both sides of a thin circuit board 114. An M.2 connector edge of the PCIe M.2 PCA 106, shown generally at 110, is disposed within the M.2 connector 104 of the PCI PCB 102. The other end of the PCIe M.2 PCA 106 is secured to the PCI PCB 102 by a fastener 112.

Figure 2:
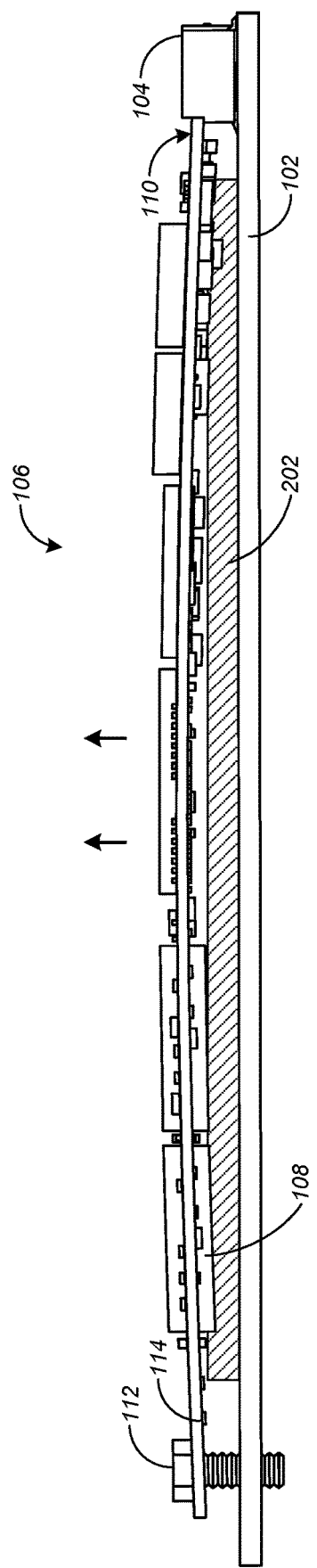
FIG. 2 depicts one approach to cooling the integrated circuits of the PCI Express M.2 printed circuit assembly of FIG. 1.

FIG. 2 depicts one approach to cooling the integrated circuits 108 of the PCIe M.2 PCA 106 of FIG. 1. According to this approach, a thermal interface pad 202 is disposed between the PCIe M.2 PCA 106 and the PCI PCB 102. This approach allows heat generated by the PCIe M.2 PCA 106 to pass to, and be dissipated by, the PCI PCB 102. However, because the circuit board 114 of the PCIe M.2 PCA 106 is very thin, and is secured only at each end, pressure applied by the flexible thermal interface pad 202 to the integrated circuits 108 mounted on the underside of the PCIe M.2 PCA 106 causes the PCI Express in the PCIe M.2 PCA 106 to bend upward. In some applications, temperature differentials in the PCA may be sufficiently great to cause or increase this bend. This bending can cause components mounted on the PCIe M.2 PCA 106, such as the integrated circuits 108, to pop off of the circuit board 114 of the PCIe M.2 PCA 106. Various embodiments disclosed herein solve this problem by enclosing the PCIe M.2 PCA 106 in a rigid metal structure that both dissipates heat generated by the PCIe M.2 PCA 106, and prevents flexure of the PCIe M.2 PCA 106 both through its rigidity and through rapid and even heat dissipation.

Figure 3A:
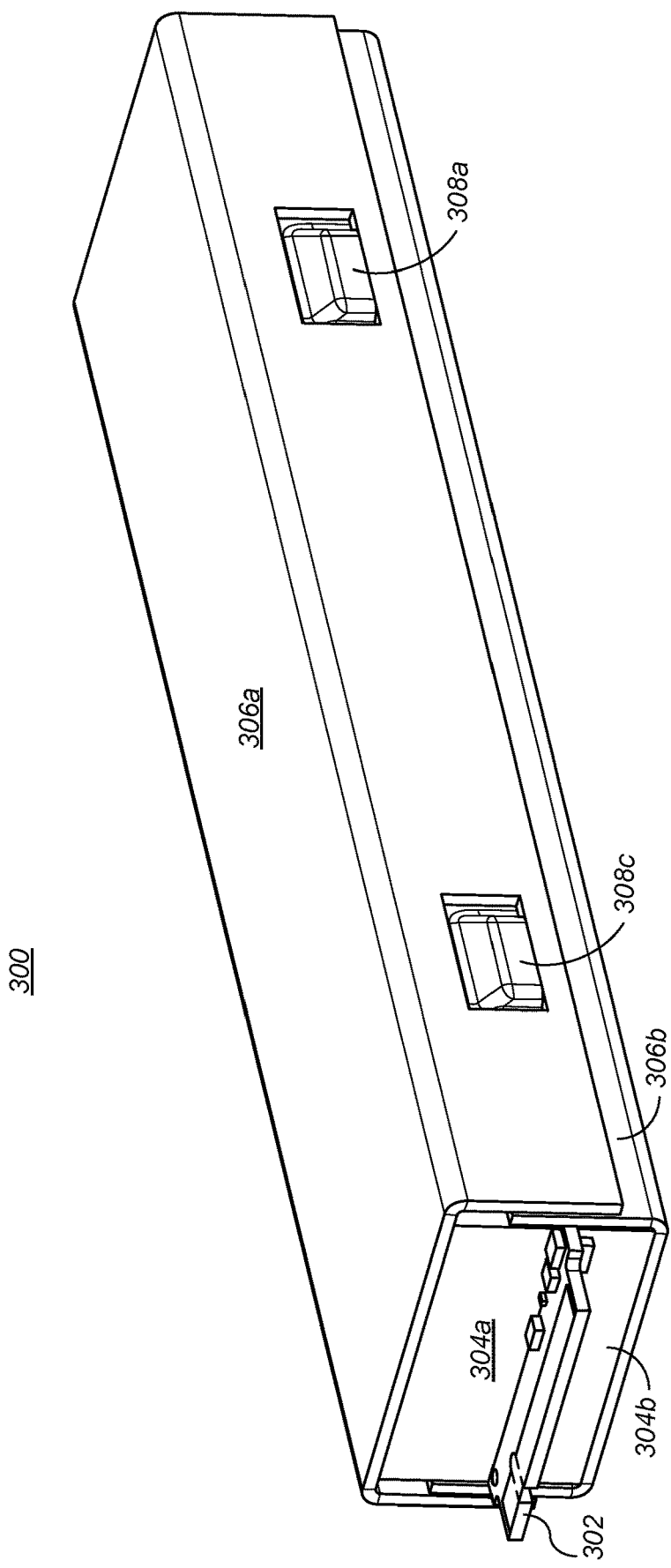
FIGS. 3A and 3B show an integrated circuit module according to a first embodiment.
Figure 3B:
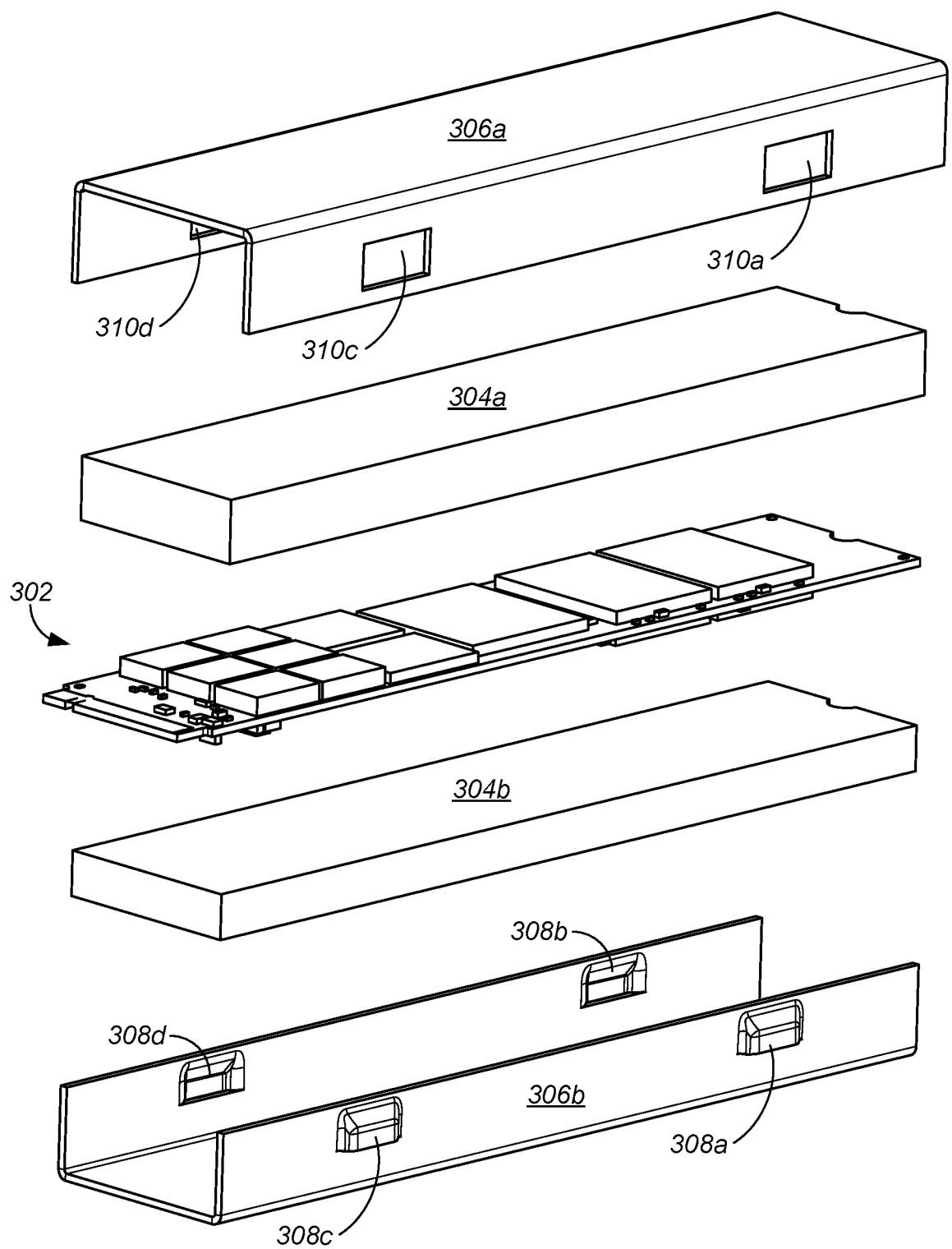

FIGS. 3A and 3B show an integrated circuit module 300 according to a first embodiment. FIG. 3A is a perspective view of the integrated circuit module 300 in its assembled state. An exploded view of integrated circuit module 300 is shown in FIG. 3B. The integrated circuit module 300 includes a PCIe M.2 PCA 302, for example, such as the PCIe M.2 PCA 106 of FIG. 1.

Referring to FIG. 3B, the integrated circuit module 300 also includes two layers of thermal interface material 304a,b and two heat spreaders 306a,b. One common thermal interface material is a thermal gap pad. However, other thermal interface materials may be used. The heat spreaders 306a,b may be made of aluminum. However, other materials that are sufficiently rigid and thermally conductive may be used to form the heat spreaders 306a,b, for example such as stainless steel, or the like.

The PCIe M.2 PCA 302 is disposed between the two layers of thermal interface material 304a,b such that the integrated circuits 108 are thermally coupled with one of the layers of thermal interface material 304a,b. As used herein, two objects are "thermally coupled" when the two objects are either in direct contact with one another or they are in direct contact with one or more thermally conductive intermediaries that form a thermally conductive path between the two objects. As used herein, an object comprising a continuous body of the same material is considered "thermally conductive" if the material forming the object is 'thermally conductive'. As used herein, a material is "thermally conductive" if it has thermal conductivity (often denoted k, λ, or κ) of 7 W·m$^{-1}$·K$^{-1}$ or greater at any temperature between 0° C. and 100° C. As used herein, an object comprising multiple distinct bodies (possibly of different materials) is considered "thermally conductive" if the object as a whole has a heat transfer coefficient of 10 W·m$^{-2}$·K$^{-1}$ or greater from one end of the object to the other end of the object at any temperature between 0° C. and 100° C. An example of a thermally conductive object that comprises multiple distinct bodies is a heat pipe. The two heat spreaders 306a,b are adapted to removably retain one another, and when retaining one another to enclose and become thermally coupled with the two layers of thermal interface material 304a,b.

In the embodiment of FIG. 3, one of the heat spreaders 306a includes four tabs 308a,b,c,d, and the other heat spreader 306b includes four corresponding voids 310a,b,c,d. In the embodiment of FIG. 3, the heat spreaders 306a,b have a shaped cross section. However, in other embodiments, other cross-sectional shapes may be employed. The heat spreaders 306a,b may be snapped together such that they retain one another when the tabs 308a,b,c,d are disposed within the corresponding voids 310a,b,c,d. When assembled, as shown in FIG. 3A, the integrated circuit module 300 both dissipates heat generated by the PCIe M.2 PCA 302, and provides a rigid structure that prevents flexure of the PCIe M.2 PCA 302. In contrast to the solution of FIG. 2, the pressure applied by one layer of thermal interface material 304a to one side of the PCIe M.2 PCA 302 is balanced by the pressure applied by the other layer of thermal interface material 304b to the other side of the PCIe M.2 PCA 302.

Figure 4A:
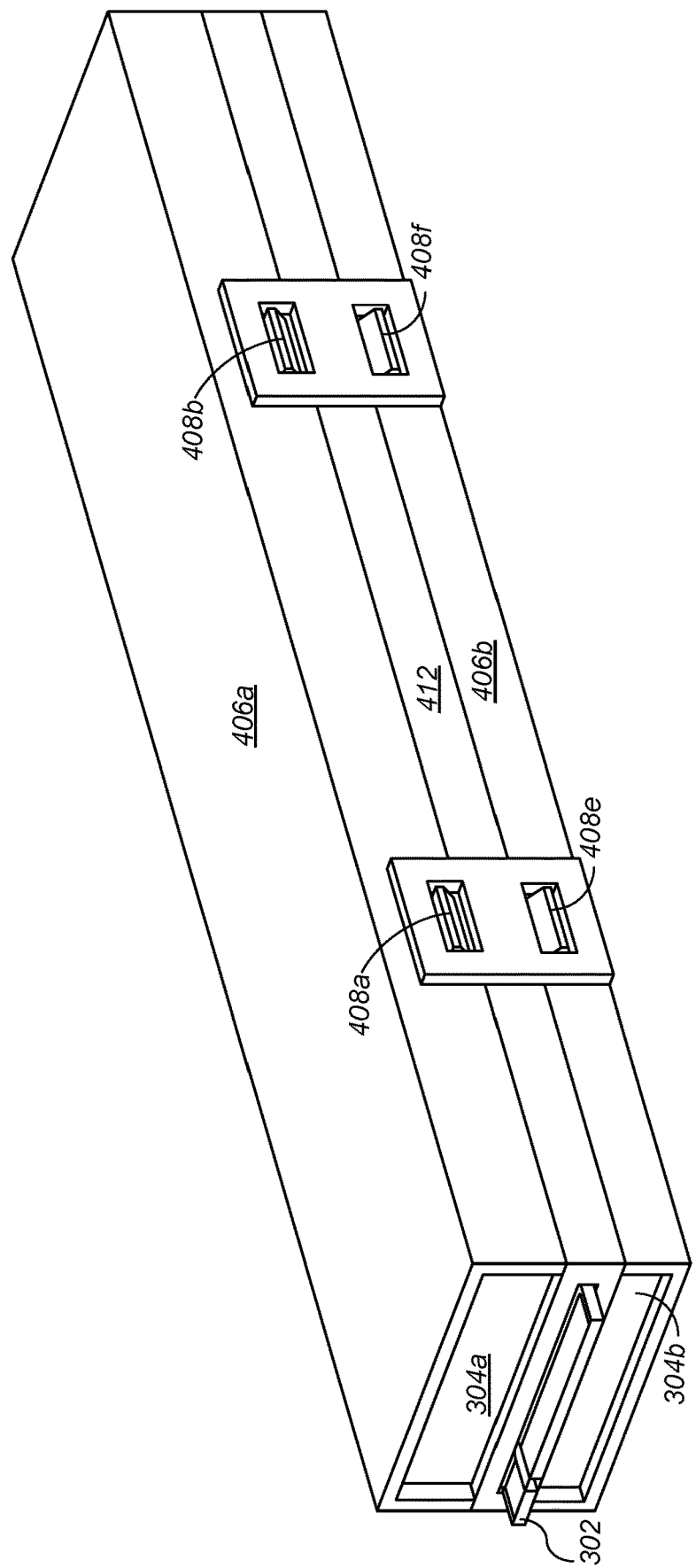
FIGS. 4A and 4B show an integrated circuit module according to a second embodiment.
Figure 4B:
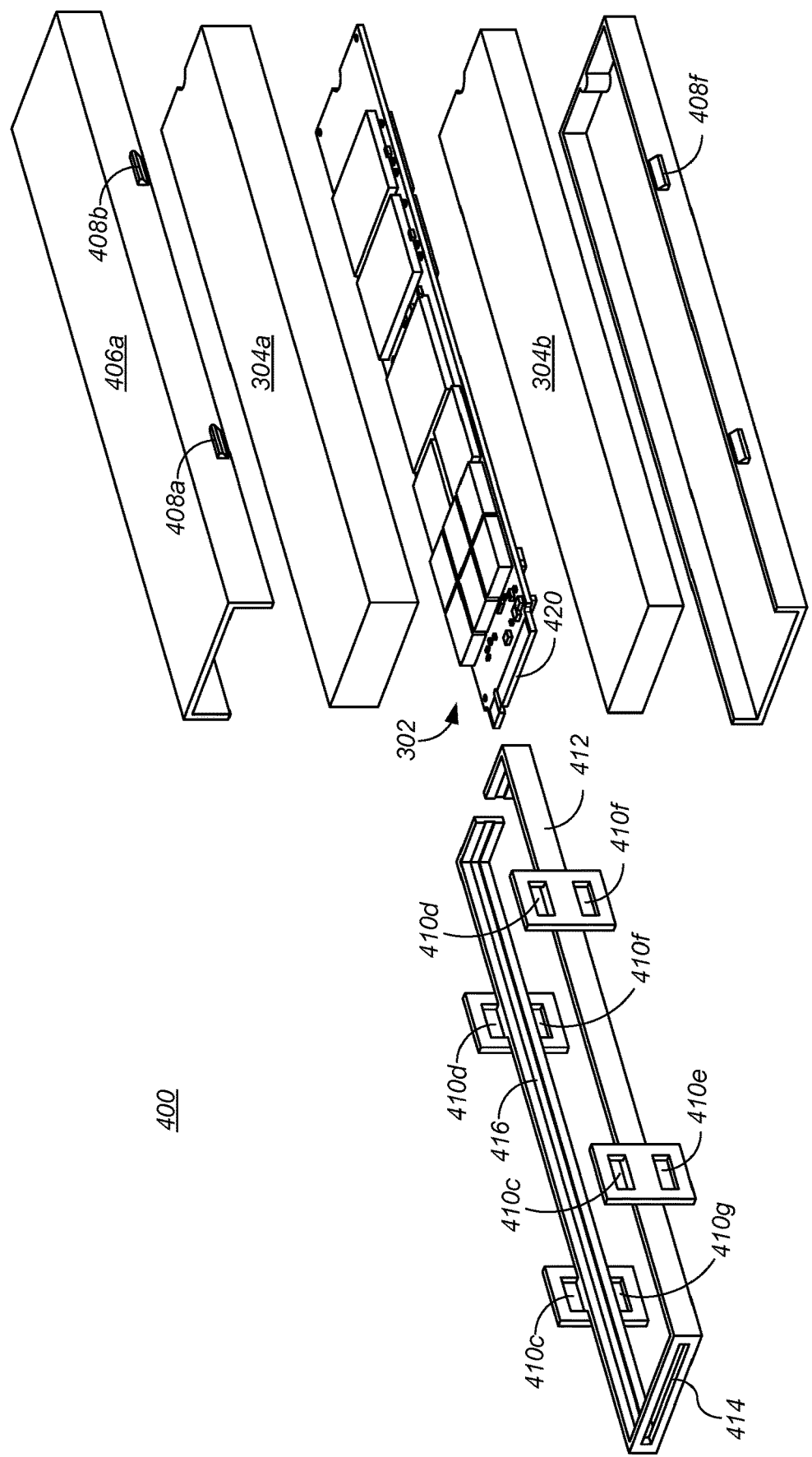

FIGS. 4A and 4B show an integrated circuit module 400 according to a second embodiment, FIG. 4A is a perspective view of the integrated circuit module 400 in its assembled state. An exploded view of integrated circuit module 400 is shown in FIG. 4B. The integrated circuit module 400 includes a PCIe M.2 PCA 302, for example, such as the PCIe M.2 PCA 106 of FIG. 1.

Referring to FIG. 4B, the example integrated circuit module 400 also includes two layers of thermal interface material 304a,b, two heat spreaders 406a,b, and a frame 412. One common thermal interface material is a thermal gap pad. However, other thermal interface materials may be used. The heat spreaders 406a,b may be made of aluminum. However, other materials may be used to form the heat spreaders 406a,b, for example such as stainless steel, or the like. The frame 412 may be made of any suitable material, such as plastic and the like.

The PCIe PCA 402 is disposed between the two layers of thermal interface material 304a,b such that the integrated circuits 108 are thermally coupled with one of the layers of thermal interface material 304a,b.

The frame 412 is adapted to removably retain the two heat spreaders 406a,b such that the two heat spreaders 406a,b enclose and become thermally coupled with the two layers of thermal interface material 304a,b. The frame 412 may include a groove 416 to receive an edge of the PCIe M.2 PCA 302. The frame 412 may include an opening 414 to receive a M.2 connector edge 420 of the PCIe M.2 PCA 302.

In the embodiment of FIG. 4, the heat spreaders 406a,b together include eight tabs 408a,b,c,d,e,f,g,h and the frame 412 includes eight corresponding voids 410a,b,c,d,e,f,g,h. In the embodiment of FIG. 4, the heat spreaders 406a,b have a C-shaped cross section. However, in other embodiments, other cross-sectional shapes may be employed. The heat spreaders 406a,b and the frame 412 may be snapped together such that the frame 412 retains the heat spreaders 406a,b when the tabs 408a,b,c,d,e,f,g,h are disposed within the corresponding voids 410a,b,c,d,e,f,g,h. When assembled, as shown in FIG. 4A, the integrated circuit module 400 both dissipates heat generated by the PCIe M.2 PCA 302, and provides a rigid structure that prevents flexure of the PCIe M.2 PCA 302. Although this example illustrates eight tabs 408a,b,c,d,e,f,g,h and eight corresponding voids 410a,b,c,d,e,f,g,h, in other implementations, other quantities of tabs and corresponding voids can be used.

Figure 5:
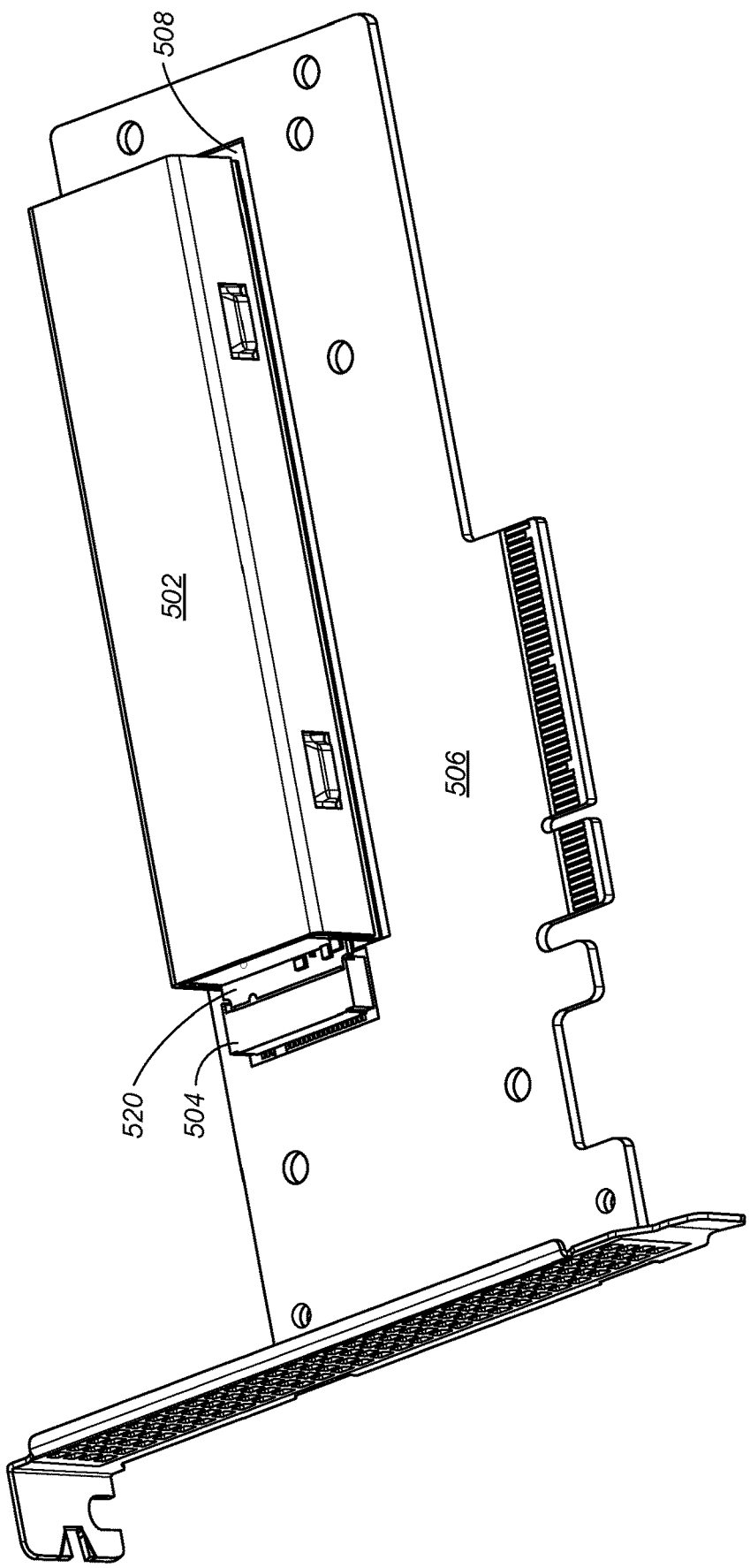
FIG. 5 shows an integrated circuit module mounted on a PCI printed circuit board

FIG. 5 shows an integrated circuit module 502 mounted on a PCI PCB 506. The integrated circuit module 502 may be implemented as the integrated circuit module 300 of FIGS. 3A,B or the integrated circuit module 400 of FIGS. 4A,B. An M.2 connector 504 is mounted on the PCI PCB 506. A M.2 connector edge 420 of the integrated circuit module 502 is disposed within the M.2 connector 504. The opposite end of the integrated circuit module 502 may be mechanically coupled with the PCI PCB 506 by any fastener, for example such as a screw, bolt, or the like. For example, an extension provided on either the heat spreaders 306a,b or 406a,b or the frame 412 may be secured with a screw or locking tab with a release tab residing on the PCI PCB 506.

In the embodiment depicted in FIG. 5, the PCI PCB 506 includes a through-hole 508 to accommodate the thickness of the integrated circuit module 502. In other embodiments, the integrated circuit module 502 is mounted upon, and thermally coupled to, the PCI PCB 506. In such embodiments, the PCI PCB 506 dissipates heat generated by the integrated circuits. In some embodiments, the PCI PCB 506 may include a metal layer or other thermal interface material that is thermally coupled to the PCI PCB 506. In such embodiments, the metal layer dissipates heat generated by the integrated circuits. The metal layer may be made of copper or the like.

Figure 6A:
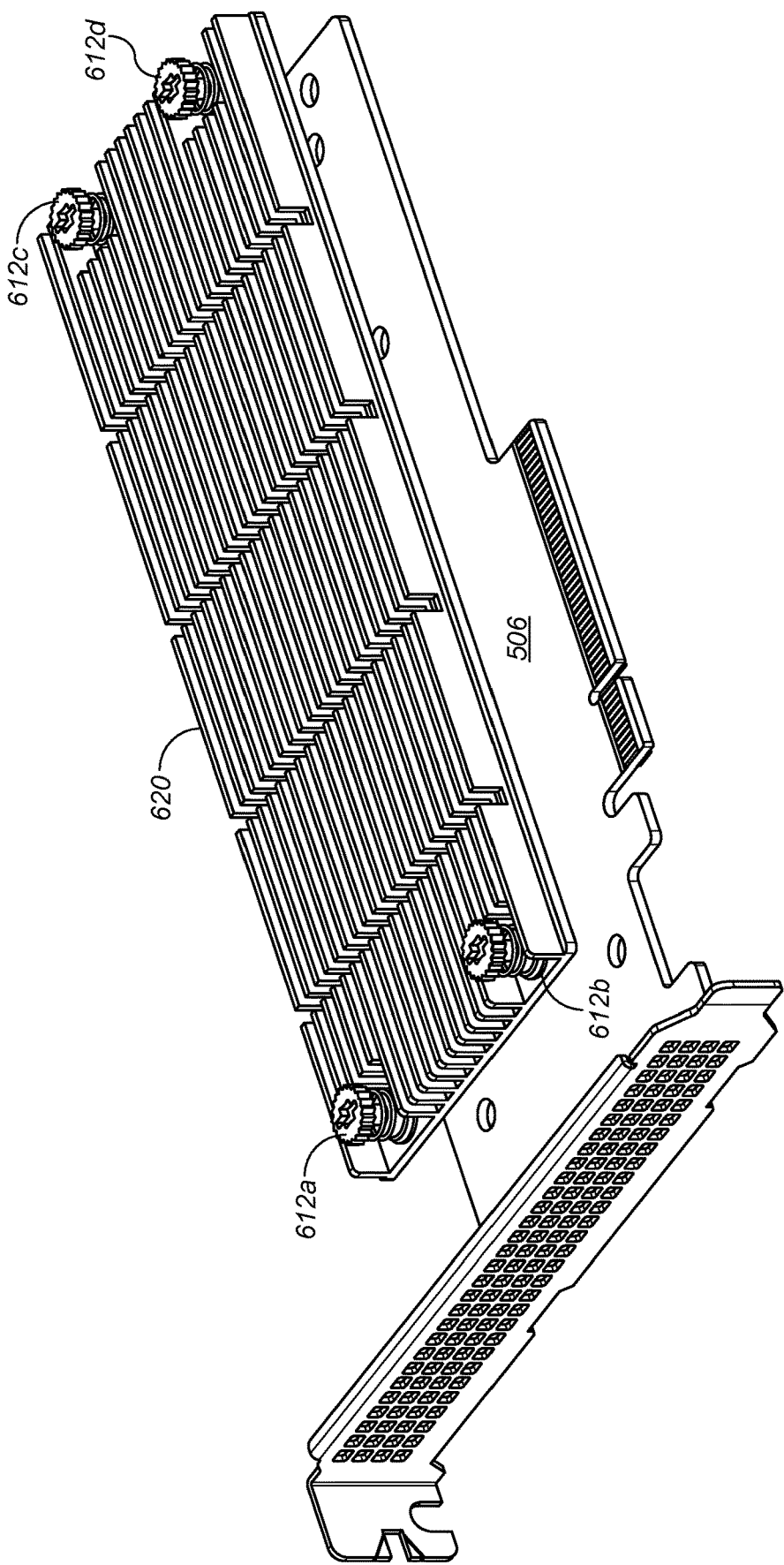
FIG. 6A shows a heat sink mounted on the PCI circuit board, and thermally coupled to the integrated circuit module.
Figure 6B:
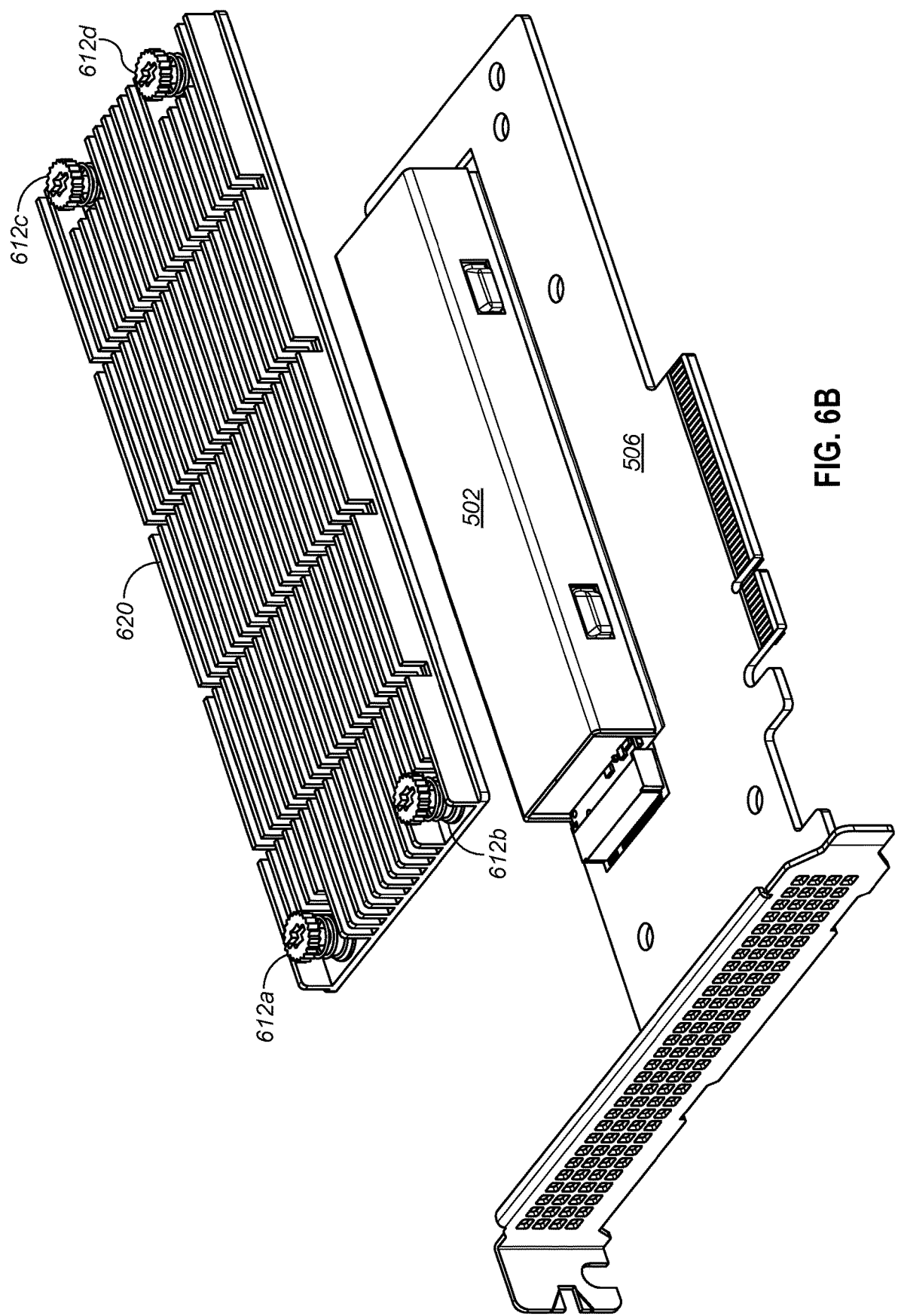
FIG. 6B shows an exploded view with an integrated circuit module mounted on a PCI circuit board and a heat sink.

Some embodiments include a heat sink. FIG. 6B shows an exploded view with the integrated circuit module 502 mounted on the PCI PCB 506 and a heat sink 620. Any suitable heat sink may be used. FIG. 6A shows the heat sink 620 mounted on the PCI PCB 506, and thermally coupled to the integrated circuit module 502. Any suitable fastener may be used to mechanically attach the heat sink 620 to the PCI PCB 506, for example such as screws 612a,b,c,d shown in FIGS. 6A,B. In some embodiments, a thermal interface material is disposed between the heat sink 620 and the integrated circuit module 602. Any suitable thermal interface material may be used, for example such as thermal grease. The heat sink 620 not only dissipates heat generated by the integrated circuits, but also provides additional rigidity to the integrated circuit module 502.

Figure 7A:
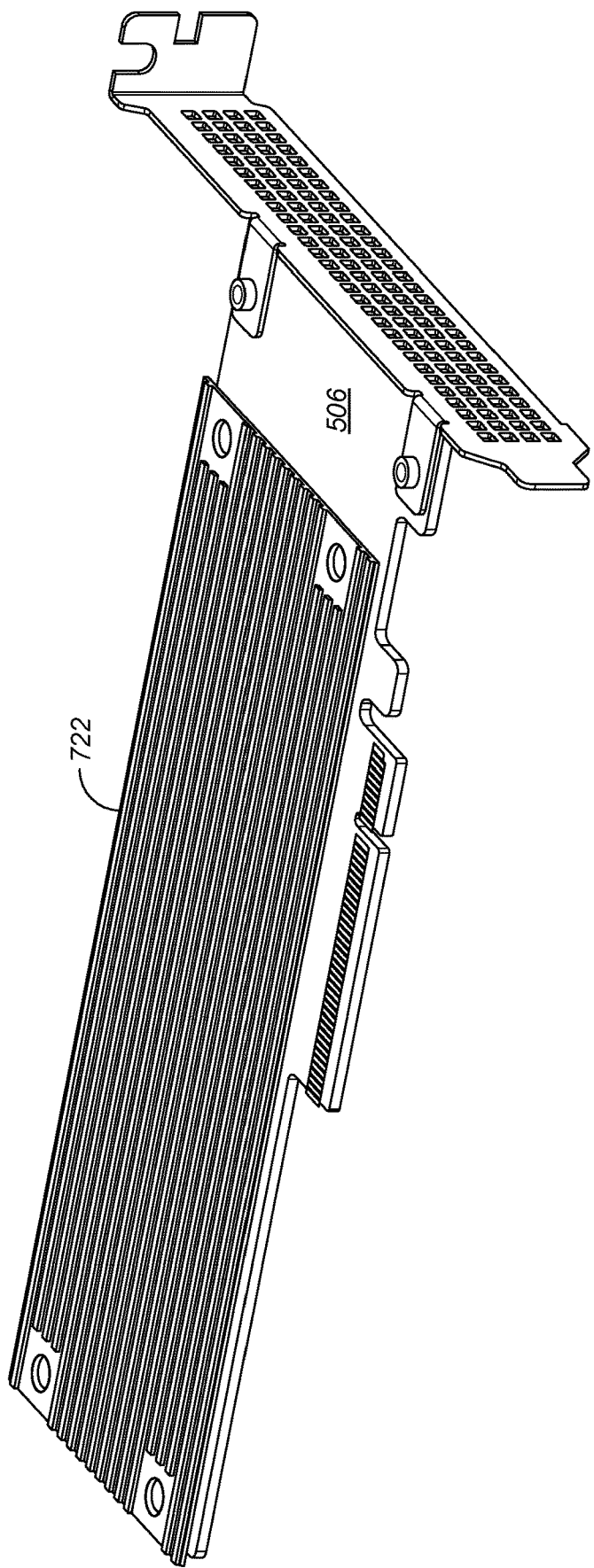
FIG. 7A shows the heat sink mounted on the underside of the PCI circuit board, and thermally coupled to the integrated circuit module.
Figure 7B:
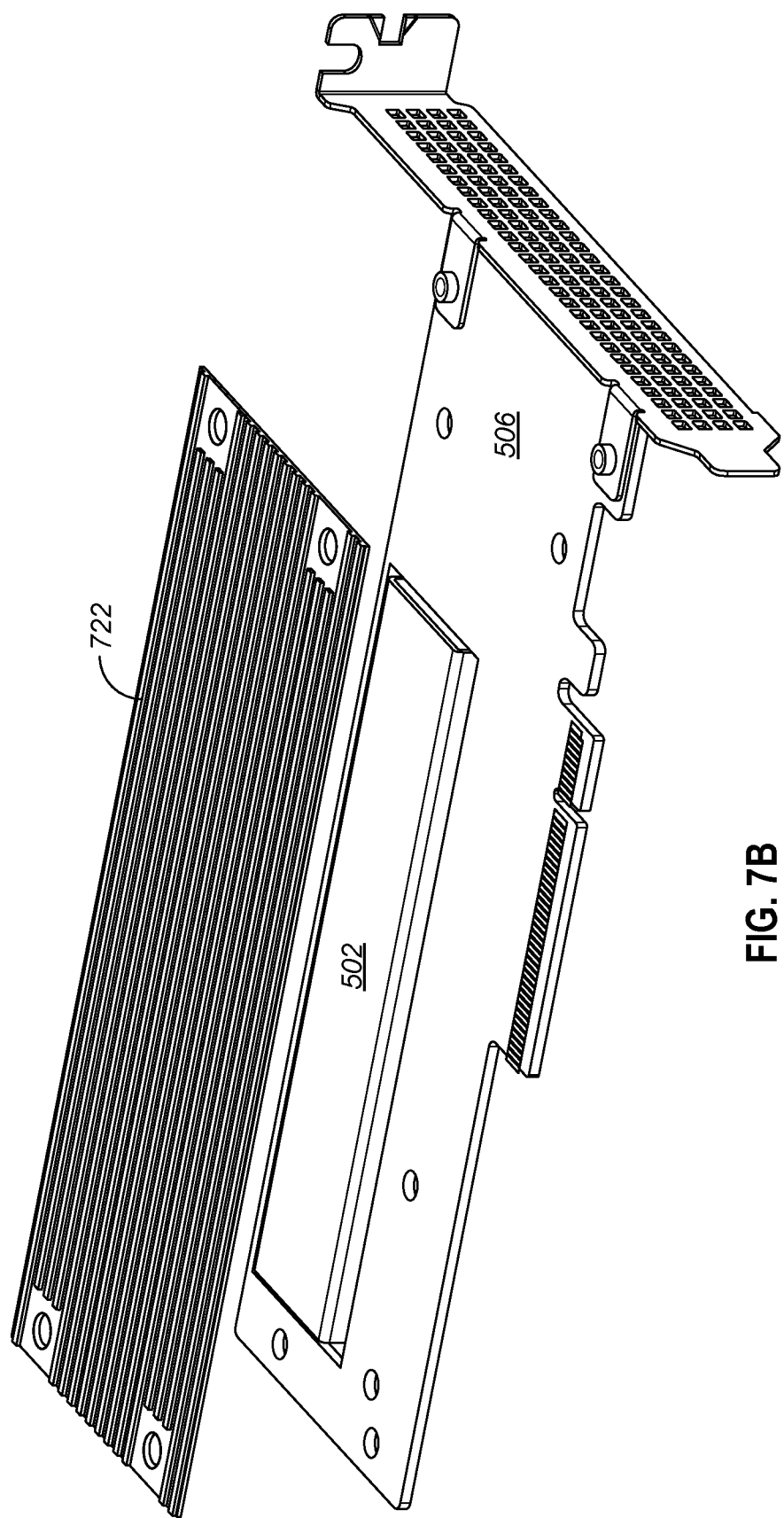
FIG. 7B shows an exploded view with the integrated circuit module mounted on a PCI circuit board and a heat sink.

Some embodiments include a second heat sink mounted on a second side of the PCI PCB. FIG. 7B shows an exploded view with the integrated circuit module 502 mounted on a PCI PCB 506 and a heat sink 720. Any suitable heat sink may be used. FIG. 7A shows the heat sink 720 mounted on the underside of the PCI PCB 506, and thermally coupled to the integrated circuit module 502. Any suitable fastener may be used to mechanically attach the heat sink 722 to the underside of the PCI PCB 506, for example such as screws 712*a,b,c,d* shown in FIG. 7. In some embodiments, a thermal interface material is disposed between the heat sink 720 and the integrated circuit module 702. Any suitable thermal interface material may be used, for example such as thermal grease. The heat sink 720 not only dissipates heat generated by the integrated circuits, but also provides additional rigidity to the integrated circuit module 502.

Figure 8:
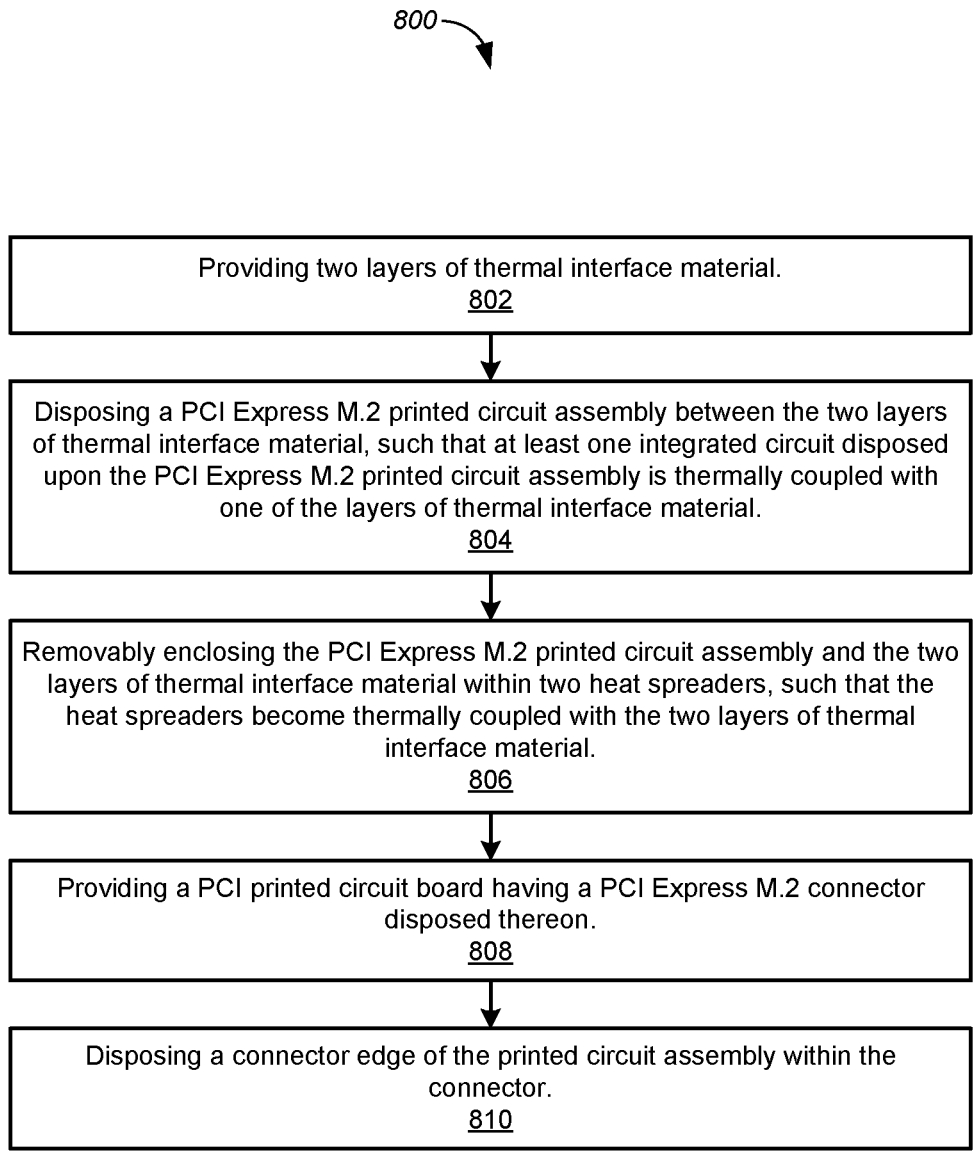
FIG. 8 shows a process according to one embodiment.

FIG. 8 shows a process 800 according to one embodiment. Although the steps of the process are shown in a particular sequence, some or all of the steps may be performed in other sequences, in parallel, or combinations thereof. Some of the steps may be omitted. Referring to FIG. 8, the process 800 includes providing two layers of thermal interface material, at 802.

The process 800 includes disposing a PCIe M.2 PCA between the two layers of thermal interface material, such that at least one integrated circuit disposed upon the PCIe M.2 PCA is thermally coupled with one of the layers of thermal interface material, at 804. Any thermal interface material may be used, for example, such as a thermal gap pad.

The process 800 includes removably enclosing the PCIe M.2 PCA and the two layers of thermal interface material within two heat spreaders, such that the heat spreaders become thermally coupled with the two layers of thermal interface material, at 806. The heat spreaders may be made of aluminum. However, other materials may be used to form the heat spreaders, for example such as stainless steel, or the like.

The process 800 includes providing a PCI PCB having a PCI Express M.2 connector disposed thereon, at 808. The process 800 includes disposing a connector edge of the printed circuit assembly within the connector, at 810. The process 800 may also include thermally coupling one of the heat spreaders to the PCI PCB. The process 800 may also include thermally coupling a metal layer to the PCI PCB. The process 800 may also include thermally coupling heat sinks to one or both of the heat spreaders. The process 800 may also include disposing the integrated circuit module in a through-hole of the PCI PCB, mechanically attaching a first heat sink to a first side of the PCI PCB, and mechanically attaching a second heat sink to a second side of the PCI PCB.

Embodiments of the present invention provide numerous benefits. As mentioned above, the disclosed technology provides enhanced heat dissipation. And in contrast to other approaches, the disclosed embodiments provide a thermal interface surface for both sides of the M.2 PCA. These benefits allow the use of higher-power and faster M.2 modules than before.

The disclosed technology provides strength and rigidity to the PCIe M.2 PCA, which can reduce mechanical failures during shock and vibration testing. And as mentioned above, this rigidity prevents flexure of the PCIe M.2 PCA, thereby preventing separation of the PCIe M.2 circuit board and components mounted thereon.

Embodiments of the present invention are compatible with several current M.2 designs. The disclosed embodiments are tool-less because the heat spreaders may be snapped together by hand.

Currently the PCI Express design specification is loosely followed or even violated by many of the M.2 module developers in the industry. As a result, it can be difficult for a manufacturer of a computing device to cost effectively provide heat dissipation solutions for M.2 modules that are sourced from different M.2 manufacturers, since the computing device manufacturer may need to design a unique solution for each variation of the M.2 module, which increases costs and complexity of the manufacturing process. Thus, an additional benefit of the examples disclosed herein is that they are essentially universal, meaning that they can be used with pretty much any variation of the M.2 module even if it deviates from the M.2 specifications. In particular, in examples disclosed herein, the TIM on other side of the M.2 module may provide some give or tolerance that allows for variation in the height of the integrated circuits 108 above the board 114, variation in the placement of the integrated circuits 108, variation in the thickness of the board 114, etc. In addition, different lengths of M.2 modules can be accommodated in the heat spreaders 306*a,b* and 406*a,b*, and the heat spreaders 306*a,b* and 406*a,b* may be dimensioned to allow for some variation in the width of the M.2 modules. Such a universal mounting and thermal solution eliminates the need for unique heat sink designs for different M.2 modules, thus reducing the types of inventory and factory spares that must be stocked.

In common usage, the term "or" can have an inclusive sense or an exclusive sense. As used herein, the term "or" should always be construed in the inclusive sense unless the exclusive sense is specifically indicated or logically necessary. The exclusive sense of "or" is specifically indicated when, for example, the term "or" is paired with the term "either", as in "either A or B". As another example, the exclusive sense may also be specifically indicated by appending "exclusive" or "but not both" after the list of items, as in "A or B, exclusive" and "A or B but not both". Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An apparatus comprising:
an integrated circuit module comprising
two layers of thermal interface material,
a printed circuit assembly disposed between the two layers of thermal interface material and comprising a plurality of integrated circuits disposed on both sides of a circuit board, wherein at least one of the integrated circuits is thermally coupled with one of the layers of thermal interface material,
two heat spreaders adapted to removably retain one another, and when retaining one another to enclose and become thermally coupled with the two layers of thermal interface material, and
a heat sink thermally coupled to a first one of the heat spreaders; and
a printed circuit board having a connector disposed thereon, wherein a connector edge of the printed circuit assembly is disposed within the connector.

2. The apparatus of claim 1, wherein:
the printed circuit assembly is a PCI Express M.2 printed circuit assembly;
the connector is a PCI Express M.2 connector; and
the printed circuit board is a PCI printed circuit board.

3. The apparatus of claim 1, wherein:
a first one of the heat spreaders is thermally coupled to the printed circuit board.

4. The apparatus of claim 1, further comprising:
a further heat sink thermally coupled to a second one of the heat spreaders.

5. The apparatus of claim 4, wherein:
the integrated circuit module is disposed in a through-hole of the printed circuit board;
the heat sink is mechanically attached to a first side of the printed circuit board; and
the further heat sink is mechanically attached to a second side of the printed circuit board.

6. The apparatus of claim 1, wherein:
a first one of the heat spreaders includes at least one tab; and
a second one of the heat spreaders includes at least one void;
wherein the heat spreaders retain one another when the tab is disposed within the void.

7. An apparatus comprising:
an integrated circuit module comprising
two layers of thermal interface material,
a printed circuit assembly disposed between the two layers of thermal interface material and comprising a plurality of integrated circuits disposed on both sides of a circuit board, wherein at least one of the integrated circuits is thermally coupled with one of the layers of thermal interface material,
two heat spreaders, and
a frame to removably retain the two heat spreaders such that the two heat spreaders enclose and become thermally coupled with the two layers of thermal interface material, and
a heat sink thermally coupled to a first one of the heat spreaders; and
a printed circuit board having a connector disposed thereon, wherein a connector edge of the printed circuit assembly is disposed within the connector.

8. The apparatus of claim 7, wherein:
the printed circuit assembly is a PCI Express M.2 printed circuit assembly;
the connector is a PCI Express M.2 connector; and
the printed circuit board is a PCI printed circuit board.

9. The apparatus of claim 7, wherein:
a first one of the heat spreaders is thermally coupled to the printed circuit board.

10. The apparatus of claim 7, further comprising:
a further heat sink thermally coupled to a second one of the heat spreaders.

11. The apparatus of claim 10, wherein:
the integrated circuit module is disposed in a through-hole of the printed circuit board;
the heat sink is mechanically attached to a first side of the printed circuit board; and
the further heat sink is mechanically attached to a second side of the printed circuit board.

12. The apparatus of claim 7, wherein:
each of the heat spreaders includes at least one tab; and
the frame includes at least one void;
wherein the frame retains the heat spreaders when the tab is disposed within the void.

13. A method comprising:
providing an integrated circuit module comprising
providing two layers of thermal interface material,
disposing a printed circuit assembly between the two layers of thermal interface material, such that at least one integrated circuit disposed upon the printed circuit assembly is thermally coupled with one of the layers of thermal interface material, and
removably enclosing the printed circuit assembly and the two layers of thermal interface material within two heat spreaders, such that the heat spreaders become thermally coupled with the two layers of thermal interface material;
thermally coupling a heat sink to a first one of the heat spreaders;
providing a printed circuit board having a connector disposed thereon; and
disposing a connector edge of the printed circuit assembly within the connector.

14. The method of claim 13, wherein:
the printed circuit assembly is a PCI Express M.2 printed circuit assembly;
the connector is a PCI Express M.2 connector; and
the printed circuit board is a PCI printed circuit board.

15. The method of claim 13, wherein:
thermally coupling a first one of the heat spreaders to the printed circuit board.

16. The method of claim 13, further comprising:
thermally coupling a further heat sink to a second one of the heat spreaders.

17. The method of claim 16, wherein:
disposing the integrated circuit module in a through-hole of the printed circuit board;
mechanically attaching the heat sink to a first side of the printed circuit board; and
mechanically attaching the further heat sink to a second side of the printed circuit board.

* * * * *